United States Patent
Popper et al.

(10) Patent No.: US 9,866,938 B2
(45) Date of Patent: Jan. 9, 2018

(54) INTERFACE FOR MICROPHONE-TO-MICROPHONE COMMUNICATIONS

(71) Applicant: Knowles Electronics, LLC, Itasca, IL (US)

(72) Inventors: Robert Popper, Lemont, IL (US); Dibyendu Nandy, Naperville, IL (US); Ramanujapuram Raghuvir, Oak Brook, IL (US); Sarmad Qutub, Des Plaines, IL (US); Oddy Khamharn, Lombard, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/015,973

(22) Filed: Feb. 4, 2016

(65) Prior Publication Data

US 2016/0249122 A1    Aug. 25, 2016

Related U.S. Application Data

(60) Provisional application No. 62/118,252, filed on Feb. 19, 2015.

(51) Int. Cl.
| H04R 3/00 | (2006.01) |
| H04R 1/04 | (2006.01) |
| H04R 19/00 | (2006.01) |

(52) U.S. Cl.
CPC .............. *H04R 1/04* (2013.01); *H04R 3/005* (2013.01); *B81B 2201/0257* (2013.01);
(Continued)

(58) Field of Classification Search
CPC .......... H04R 1/04; H04R 3/005; G10L 19/008
(Continued)

(56) References Cited

U.S. PATENT DOCUMENTS 5,303,307 A * 4/1994 Elko ........................ H04R 1/38
381/92
5,822,598 A   10/1998 Lam
(Continued)

FOREIGN PATENT DOCUMENTS

JP        2007-226040 A      9/2007

OTHER PUBLICATIONS

Castor-Perry, Kendall; Kannan, Vivek. "High-Quality PDM microphone interfacing Using Off-the-Shelf SoCs". EDN Network. Dec. 10, 2013.*
(Continued)

*Primary Examiner* — Shaun Roberts
(74) *Attorney, Agent, or Firm* — Foley & Lardner LLP

(57) ABSTRACT

A microphone system includes a first transducer deployed at a first microphone; a second transducer deployed at a second microphone, the first microphone being physically distinct from the second microphone; a decimator deployed at the second microphone that receives first pulse density modulation (PDM) data from the first transducer and second PDM data from the second transducer and decimates and combines the first PDM data and the second PDM data into combined pulse code modulation (PCM) data; and an interpolator deployed at the second microphone for converting the combined PCM data to combined PDM data, and transmits the combined PDM data to an external processing device.

19 Claims, 2 Drawing Sheets

(52) U.S. Cl.
CPC ...... *H04R 19/005* (2013.01); *H04R 2201/003* (2013.01); *H04R 2420/07* (2013.01)

(58) Field of Classification Search
USPC .................................. 704/500; 381/122, 92
See application file for complete search history.

(56) References Cited

U.S. PATENT DOCUMENTS

| | | | |
|---|---|---|---|
| 6,070,140 A | 5/2000 | Tran | |
| 6,154,721 A | 11/2000 | Sonnic | |
| 6,249,757 B1 | 6/2001 | Cason | |
| 6,397,186 B1 | 5/2002 | Bush et al. | |
| 6,756,700 B2 | 6/2004 | Zeng | |
| 7,190,038 B2 | 3/2007 | Dehe et al. | |
| 7,415,416 B2 | 8/2008 | Rees | |
| 7,473,572 B2 | 1/2009 | Dehe et al. | |
| 7,619,551 B1 | 11/2009 | Wu | |
| 7,774,204 B2 | 8/2010 | Mozer et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 7,933,428 B2 * | 4/2011 | Sawada ............... | H04R 1/406 257/416 |
| 7,957,972 B2 | 6/2011 | Huang et al. | |
| 8,275,148 B2 | 9/2012 | Li et al. | |
| 8,666,751 B2 | 3/2014 | Murthi et al. | |
| 8,937,515 B2 * | 1/2015 | Haiut .................. | H03M 1/00 326/52 |
| 8,972,252 B2 | 3/2015 | Hung et al. | |
| 8,996,381 B2 | 3/2015 | Mozer et al. | |
| 9,043,211 B2 | 5/2015 | Haiut et al. | |
| 9,112,984 B2 | 8/2015 | Sejnoha et al. | |
| 2005/0207605 A1 | 9/2005 | Dehe et al. | |
| 2006/0074658 A1 | 4/2006 | Chadha | |
| 2007/0278501 A1 | 12/2007 | Macpherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0086146 A1 | 4/2010 | Gong et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0007907 A1 | 1/2011 | Park et al. | |
| 2011/0013787 A1 | 1/2011 | Chang | |
| 2011/0075875 A1 | 3/2011 | Wu et al. | |
| 2011/0255709 A1 * | 10/2011 | Nishimura ............ | H04S 1/007 381/92 |
| 2012/0232896 A1 | 9/2012 | Taleb et al. | |
| 2012/0269332 A1 * | 10/2012 | Mukund ................ | H04S 3/006 379/201.06 |
| 2012/0310641 A1 | 12/2012 | Niemisto et al. | |
| 2013/0058495 A1 * | 3/2013 | Furst .................... | H04R 3/00 381/80 |
| 2013/0120060 A1 * | 5/2013 | Loeda .................. | H03G 1/0088 330/86 |
| 2013/0208915 A1 | 8/2013 | Hammerschmidt et al. | |
| 2013/0223635 A1 | 8/2013 | Singer et al. | |
| 2014/0163978 A1 | 6/2014 | Basye et al. | |
| 2014/0244269 A1 | 8/2014 | Tokutake | |
| 2014/0257821 A1 | 9/2014 | Adams et al. | |
| 2014/0274203 A1 | 9/2014 | Ganong et al. | |
| 2014/0278435 A1 | 9/2014 | Ganong et al. | |
| 2014/0281628 A1 | 9/2014 | Nigam et al. | |
| 2014/0343949 A1 | 11/2014 | Huang et al. | |
| 2015/0106085 A1 | 4/2015 | Lindahl | |
| 2015/0112690 A1 | 4/2015 | Guha et al. | |
| 2015/0134331 A1 | 5/2015 | Millet et al. | |
| 2015/0146885 A1 * | 5/2015 | Fitzgerald ............ | H04R 3/005 381/98 |

OTHER PUBLICATIONS

Kite, Thomas. "Understanding PDM Digital Audio". Audio Precision. 2012.*
Lewis, Jerad. "Analog and Digital MEMS Microphone Design Considerations." Analog Devices. 2013.*
International Search Report, PCT/US2016/016706, Knowles Electronics, LLC, 3 pages dated (May 26, 2016).
English-language machine translation of JP 2007-226040, Aiphone Co. Ltd. dated (Sep. 7, 2007).

* cited by examiner

INTERFACE FOR MICROPHONE-TO-MICROPHONE COMMUNICATIONS

CROSS-REFERENCE TO RELATED APPLICATION

This patent claims benefit under 35 U.S.C. §119(e) to U.S. Provisional Application No. 62/118,252 entitled "Interface for Microphone-to-Microphone Communication" filed Feb. 19, 2015, the content of which is incorporated herein by reference in its entirety.

TECHNICAL FIELD

This application relates to microphones and, more specifically, to communications between microphones.

BACKGROUND OF THE INVENTION

Different types of acoustic devices have been used through the years. One type of device is a microphone and one type of microphone is a microelectromechanical system (MEMS) microphone. A MEMS microphone includes a MEMS die having a diaphragm and a back plate. The MEMS die is supported by a substrate and enclosed by a housing (e.g., a cup or cover with walls). A port may extend through the substrate (for a bottom port device) or through the top of the housing (for a top port device). In any case, sound energy traverses the port, moves the diaphragm and creates a changing potential of the back plate, which creates an electrical signal. Microphones are deployed in various types of devices such as personal computers or cellular phones.

It is sometimes advantageous to utilize two or more microphones. For example, one microphone may be used for sound pick-up in one frequency range, while another microphone may be used for sound pick-up in another frequency range. The microphones are sometimes connected to a codec, which performs processing of the signals from the microphones. Because of the limitations with the interface between existing microphones and the codec, the microphones are unable to communicate with each other.

The problems of previous approaches have resulted in some user dissatisfaction with these previous approaches.

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The present approaches provide an interface with microphone-to-microphone communications. In some aspects, a two microphone interface uses a pulse density modulation (PDM) bus. The two microphones share the same clock. The PDM output of the first microphone is transmitted and received by a second microphone on a first clock edge. The second microphone decimates the signals of both microphones and converts these decimated signals into pulse code modulation (PCM) signals, where the signals are processed and converted back to PDM and then a single, combined, and processed output is sent to a codec (or some other external device) on a second clock edge of the clock. The codec will see only the single combined signal (although the codec may receive although not process the signal sent from the first microphone to the second microphone on the first clock edge).

Figure 1:
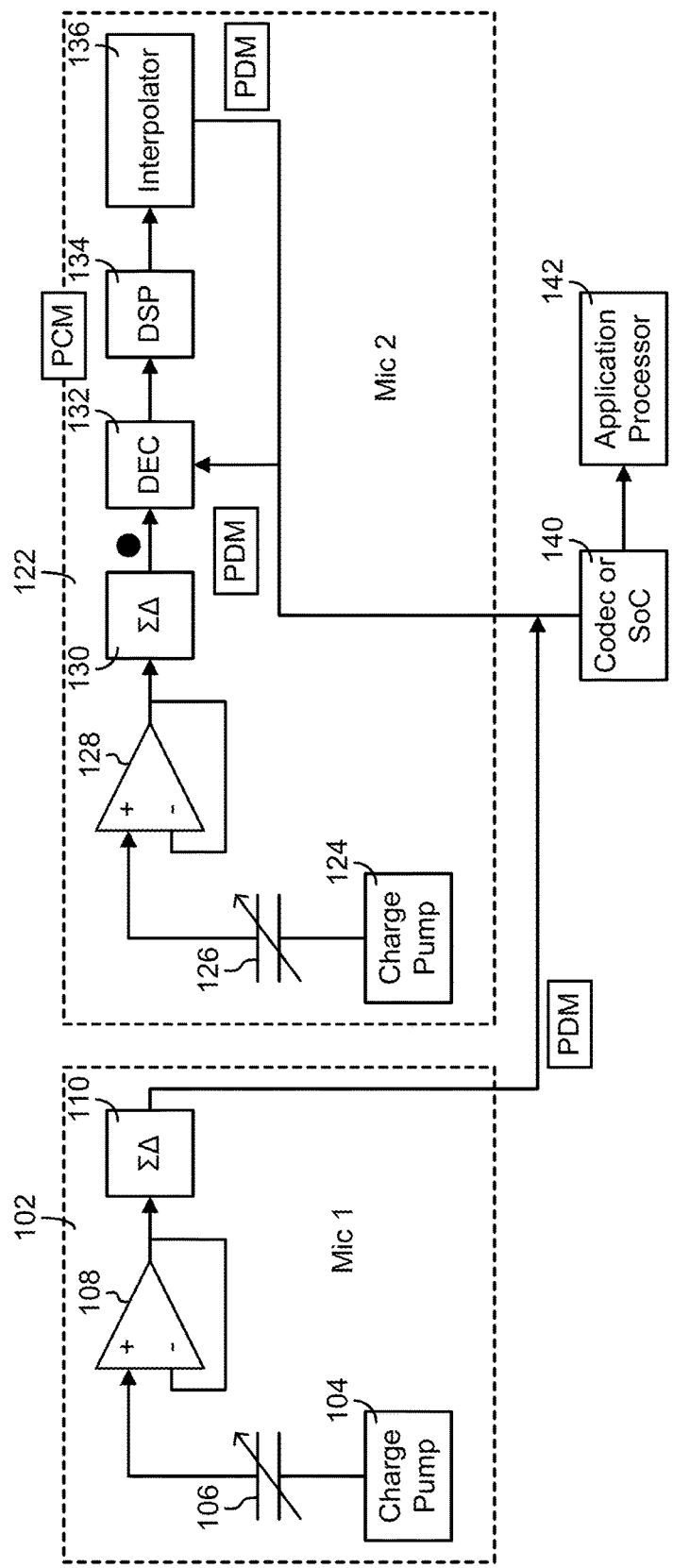
FIG. 1 is a block diagram of a system including two microphones and an interface between the two microphones according to various embodiments of the present invention.
Figure 2:
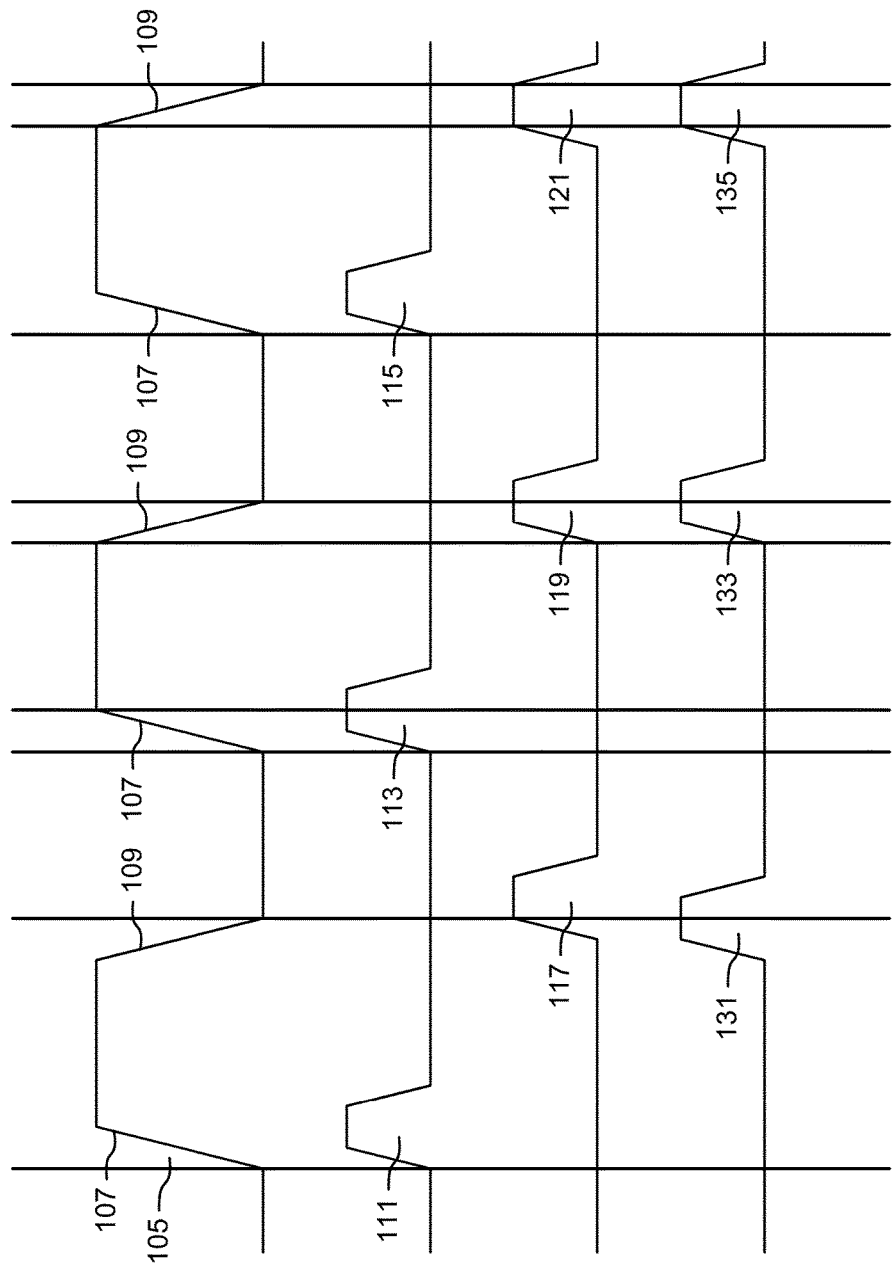
FIG. 2 is a timing diagram showing the operation of the microphone-to-microphone interface shown in FIG. 1 according to various embodiments of the present invention.

Referring now to FIG. 1 and FIG. 2, one example of an interface that provides microphone-to-microphone communication is described. A first microphone 102 includes a first charge pump 104, a first micro electro mechanical system (MEMS) transducer 106, a first amplifier 108, and a first sigma delta converter 110.

A second microphone 122 includes a second charge pump 124, a second micro electro mechanical system (MEMS) transducer 126, a second amplifier 128, a second sigma delta converter 130, a decimator 132, a digital signal processor (DSP) 134, and an interpolator 136. The first MEMS microphone 102 and the second MEMS microphone 122 share a clock 105. The hardware clock that provides the clock signal 105 may be disposed at the codec or system on a chip (SoC) 140 in one example. Other examples are possible.

The first microphone 102 and the second microphone 122 in some aspects each include a housing that encloses the above-mentioned components. In some examples, each microphone 102, 122 includes a base, on which the components are deployed and a lid or cover that is coupled to the base and that encloses the internal components. Additionally, some of the components (e.g., sigma delta converters, decimators, and amplifiers) may be deployed on an integrated circuit that is disposed on the base.

The first charge pump 104 and second charge pump 124 provide voltages and/or current to the first MEMS transducer 106 and the second MEMS transducer 126, respectively. The first MEMS transducer 106 and the second MEMS transducer 126 convert sound energy into an electrical signal. In these regards, the first MEMS transducer 106 and the second MEMS transducer 126 may include a diaphragm and a charged back plate (with the charge provided by the charge pumps 104 and 124). Sound energy moves the diaphragms to produce an electrical signal. Although MEMS devices may be used as transducers 106 and 126, it will also be appreciated that other types of devices such as piezo electrical devices or speakers (being operated as a microphone) may also be deployed.

The first amplifier 108 and second amplifier 128 amplify the analog signals from the first MEMS transducer 106 and the second MEMS transducer 126. The first sigma delta converter 110 and the second sigma delta converter 130 convert the analog signals into pulse density modulation (PDM) signals.

The decimator 132 receives signals from the first MEMS transducer 106 and the second MEMS transducer 126 (that have been converted into PDM signals). The decimator 132 converts these PDM signals into pulse code modulation (PCM) signals for processing by the DSP 134.

The DSP 134 performs various processing functions on the signals. For example, the DSP 134 may perform noise identification (e.g., identify wind or other types of noise, perform noise suppression (removal), or ultrasonic gesture or activity detection functions). Other examples of processing functions may also be performed by the DSP 134.

The interpolator 136 converts the PCM signal from the DSP to a PDM signal for transmission to the codec 140. The codec (or system on chip (SoC)) 140 receives the combined signal.

The first microphone 102 couples to a codec 140 and to the second microphone 122 and to the codec 140. The codec 140 couples to an application processor 142. The purpose of the codec 140 is to convert the PDM signal into PCM data and provide an amplifier for speakers in electronic devices. The application processor 142 is in one aspect a system on a chip (SoC) designed to support applications running in a mobile operating system environment. In some architectures, the codec 140 is not required and the microphones 102 and 122 may be directly connected to the applications processor 142.

In one example of the operation of the system of FIG. 1 and now specifically referring to the time line of FIG. 2, the clock 105 has rising edges 107 and falling edges 109. Data 111, 113, 115 is obtained and transmitted from the first microphone 102 (sensed by the first MEMS transducer 106) to the second microphone 122 on the rising edges 107 of the clock 105.

Data 117, 119, and 121 is obtained from the second MEMS transducer 126 of the second microphone 122 on falling edges 109 of the clock 105. Combined data 131, 133, and 135 is sent from the second microphone 122 to the codec 140 on falling edges 109. The combined data is the processed audio stream from the first microphone 102 and the second microphone 122 combined and processed in the DSP in the second microphone.

It will be appreciated that there is a time lag between the reception of the data from the first microphone 102 and transmission of the combined data from the second microphone 122. For example, combined data 133 may be the combination of data 111 (from the first microphone 102) and the data 119 (from the second transducer 126 of the second microphone 122).

It will be appreciated that although in this example data is sent from the first microphone to the second microphone on a rising clock edge and sent from the second microphone to the codec on a second clock edge, that this order may be reversed. Other timing relationships may also be used.

In this way, the codec 140 receives the combined data from the two microphones 102 and 122. Microphone-to-microphone communications is supported in an efficient and seamless way.

Preferred embodiments are described herein, including the best mode known to the inventors for carrying out the same. It should be understood that the illustrated embodiments are exemplary only, and should not be taken as limiting the scope of the invention.

What is claimed is:

1. A microphone comprising:
  a housing formed by a cover and a substrate, the housing having an acoustic port;
  an external device interface;
  a transducer disposed in the housing and configured to provide an analog signal in response to changes in acoustic energy sensed via the acoustic port;
  an electrical circuit disposed in the housing, the electrical circuit including a converter configured to convert the analog signal to first pulse density modulation (PDM) data,
  the electrical circuit including a decimator configured to decimates and combine the first PDM data and second PDM data into combined pulse code modulation (PCM) data, wherein the second PDM data is received via the external device interface and is commonly clocked with the first PDM data,
  the electrical circuit including an interpolator configured to convert the combined PCM data to combined PDM data,
  wherein the combined PDM data may be output at the external device interface of the microphone.

2. The microphone of claim 1, wherein the transducer and is a micro electro mechanical system (MEMS) transducer having a diaphragm and a back plate.

3. The microphone of claim 2, wherein the electrical circuit includes a charge pump having a bias signal output coupled to the transducer.

4. The microphone of claim 3, wherein the converter, the decimator, the interpolator, and the charge pump are deployed on an integrated circuit.

5. The microphone of claim 1, wherein the external device interface includes a clock signal input.

6. The microphone of claim 1, wherein the transducer is a micro electro mechanical system (MEMS) transducer and the electrical circuit includes a voltage source coupled to the transducer.

7. The microphone of claim 6, wherein the electrical circuit is an integrated circuit.

8. A microphone comprising:
  a housing;
    a transducer disposed in the housing;
    a decimator disposed in the housing, the decimator configured to decimate and combine first pulse density modulation (PDM) data and second PDM data into combined pulse code modulation (PCM) data,
    the first PDM data based on an analog signal from the transducer and the second PDM data received at an interface of the microphone wherein the first PDM data and the second PDM data are clocked by a common clock signal;
    an interpolator disposed in the housing, the interpolator configured to convert the combined PCM data to combined PDM data; and
    a processor configured to process the combined PDM data.

9. The microphone of claim 8, wherein the transducer is a micro electro mechanical system (MEMS) transducer having a diaphragm and a back plate.

10. The microphone of claim 9, further comprising a charge pump disposed in the housing, the charge pump having a bias signal output applied to the transducer.

11. The microphone of claim 8 further comprising a sigma delta converter disposed in the housing, the sigma delta converter having an input coupled to the transducer and an output coupled to the decimator, wherein the sigma delta converter is configured to convert an analog signal from the transducer to the first PDM data.

12. The microphone of claim 11, wherein the sigma delta converter, the interpolator, and the decimator are deployed on an integrated circuit.

13. The microphone of claim 12, wherein the integrated circuit includes a voltage source coupled to the transducer.

14. A method implemented in a microphone, the method comprising:
- transducing acoustic energy into an analog signal;
- converting the analog signal to first pulse density modulation (PDM) data;
- receiving second PDM data from another microphone via an interface of the microphone, wherein the first PDM data and the second PDM data are synchronized;
- decimating and combining the first PDM data and the second PDM data into combined pulse code modulation (PCM) data;
- converting the combined PCM data to combined PDM data;
- transmitting the combined PDM data to an external processing device.

15. The method of claim 14, further comprising transducing the acoustic energy into the analog signal using a micro electro mechanical system (MEMS) transducer of the microphone.

16. The method of claim 15 further comprising applying a bias voltage to the transducer with a charge pump circuit of the microphone.

17. The method of claim 16 further comprising converting the analog signal to first pulse density modulation (PDM) data with a sigma delta converter circuit of the microphone.

18. The method of claim 14 further comprising decimating and combining the first PDM data and the second PDM data into combined pulse code modulation (PCM) data with a decimator circuit of the microphone.

19. The method of claim 14 further comprising converting the combined PCM data to combined PDM data with an interpolator circuit of the microphone.

* * * * *